United States Patent
Soma et al.

(10) Patent No.: US 7,560,797 B2
(45) Date of Patent: Jul. 14, 2009

(54) SEMICONDUCTOR DEVICE AND MANUFACTURING METHOD OF THE SAME

(75) Inventors: Mitsuru Soma, Saitama (JP); Hirotsugu Hata, Gunma (JP); Minoru Akaishi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 12 days.

(21) Appl. No.: 11/635,812

(22) Filed: Dec. 8, 2006

(65) Prior Publication Data

US 2007/0145520 A1 Jun. 28, 2007

(30) Foreign Application Priority Data

Dec. 9, 2005 (JP) .............................. 2005-356008

(51) Int. Cl.
*H01L 27/102* (2006.01)
(52) U.S. Cl. ........................ 257/565; 257/547; 257/549; 257/550; 257/552; 257/E29.199
(58) Field of Classification Search ................. 259/526, 259/547, 549, 550, 552, 565, E29.197, E29.198, 259/E29.199
See application file for complete search history.

(56) References Cited

U.S. PATENT DOCUMENTS

| | | | |
|---|---|---|---|
| 4,902,633 A * | 2/1990 | Cambou | ...................... 438/357 |
| 5,455,447 A | 10/1995 | Hutter et al. | |
| 5,565,701 A * | 10/1996 | Zambrano | ................... 257/500 |
| 5,731,617 A | 3/1998 | Suda | |
| 5,786,265 A | 7/1998 | Hwang et al. | |
| 5,798,560 A | 8/1998 | Ohkawa et al. | |
| 6,590,273 B2 | 7/2003 | Okawa et al. | |
| 6,822,298 B2 | 11/2004 | Kaneko et al. | |
| 7,067,899 B2 | 6/2006 | Kanda | |
| 2002/0079554 A1 | 6/2002 | Okawa et al. | |
| 2003/0141530 A1 | 7/2003 | Kaneko et al. | |
| 2005/0077571 A1 | 4/2005 | Kanda et al. | |
| 2007/0145530 A1 | 6/2007 | Soma | |
| 2007/0158754 A1 | 7/2007 | Soma | |

FOREIGN PATENT DOCUMENTS

CN 1138749 12/1996

(Continued)

OTHER PUBLICATIONS

Korean Office Action dated Oct. 30, 2007, directed to related KR application No. 2007-058476485.

*Primary Examiner*—Matthew E Warren
(74) *Attorney, Agent, or Firm*—Morrison & Foerster LLP

(57) ABSTRACT

In a semiconductor device of the present invention, two epitaxial layers are formed on a P type single crystal silicon substrate. One of the epitaxial layers has an impurity concentration higher than that of the other epitaxial layer. The epitaxial layers are divided into a plurality of element formation regions by isolation regions. In one of the element formation regions, an NPN transistor is formed. Moreover, between a P type diffusion layer, which is used as a base region of the NPN transistor, and a P type isolation region, an N type diffusion layer is formed. Use of this structure makes it hard for a short-circuit to occur between the base region and the isolation region. Thus, the breakdown voltage characteristics of the NPN transistor can be improved.

5 Claims, 9 Drawing Sheets

FOREIGN PATENT DOCUMENTS

| | | |
|---|---|---|
| CN | 1361552 | 7/2002 |
| CN | 1428864 | 7/2003 |
| CN | 1604329 | 4/2005 |
| JP | 09-283646 | 10/1997 |
| KR | 100175368 | 11/1998 |

* cited by examiner

Prior Art

US 7,560,797 B2

SEMICONDUCTOR DEVICE AND MANUFACTURING METHOD OF THE SAME

BACKGROUND OF THE INVENTION

Priority is claimed to Japanese Patent Application Number JP2005-356008 filed on Dec. 9, 2005, the disclosure of which is incorporated herein by reference in its entirety.

1. Field of the Invention

The present invention relates to a semiconductor device which realizes reduction in a device size while maintaining breakdown voltage characteristics thereof, and a method of manufacturing the same.

2. Description of the Prior Art

As an example of a conventional semiconductor device, a structure of the following NPN transistor 61 has been known. As shown in FIG. 9, an N type epitaxial layer 63 is formed on a P type semiconductor substrate 62. In the epitaxial layer 63, P type buried diffusion layers 64 and 65, which expand vertically (in a depth direction) from a surface of the substrate 62, and P type diffusion layers 66 and 67, which expand from a surface of the epitaxial layer 63, are formed. Moreover, the epitaxial layer 63 is divided into a plurality of element formation regions by isolation regions 68 and 69 which are formed by connecting the P type buried diffusion layers 64 and 65 with the P type diffusion layers 66 and 67, respectively. In one of the element formation regions, for example, the NPN transistor 61 is formed. The NPN transistor 61 is mainly configured of: an N type buried diffusion layer 70 and an N type diffusion layer 71, which are used as a collector region; a P type diffusion layer 72 used as a base region; and an N type diffusion layer 73 used as an emitter region. This technology is described for instance in Japanese Patent Application Publication No. Hei 9 (1997)-283646 (Pages 3, 4 and 6, FIGS. 1 and 5 to 7).

As described above, in the conventional semiconductor device, the epitaxial layer 63 is formed on the semiconductor substrate 62. In the epitaxial layer 63 divided by the isolation regions 68 and 69, the NPN transistor 61 is formed. The epitaxial layer 63 is an N type low impurity concentration region. By use of this structure, when a formation region of the P type buried diffusion layer 64 or the P type diffusion layer 72 is shifted, a distance L2 between the both diffusion layers 64 and 72 is shortened to narrow a region for a depletion layer to spread. Moreover, in the NPN transistor 61, a short-circuit is likely to occur between the base region and the isolation region. As a result, there is a problem that it is difficult to achieve desired breakdown voltage characteristics. Moreover, there is a problem that a variation in the distance L2 destabilizes the breakdown voltage characteristics of the NPN transistor 61.

Moreover, in the conventional semiconductor device, a thickness of the epitaxial layer 63 is determined by taking account of a breakdown voltage of the NPN transistor 61 and the like. For example, in a case where a power semiconductor element and a control semiconductor element are monolithically formed on the same semiconductor substrate 62, the thickness of the epitaxial layer 63 is determined depending on breakdown voltage characteristics of the power semiconductor element. Moreover, the P type buried diffusion layers 64 and 65, which respectively form the isolation regions 68 and 69 expand upward from the surface of the substrate 62 toward the epitaxial layer 63. Meanwhile, the P type diffusion layers 66 and 67, which respectively form the isolation regions 68 and 69 expand downward from the surface of the epitaxial layer 63. By use of this structure, lateral expansion widths W4 and W5 respectively of the P type buried diffusion layers 64 and 65 are also increased depending on the expansion widths thereof. In order to realize a desired breakdown voltage of the NPN transistor 61, the distance L2 between the P type diffusion layer 72 and the P type buried diffusion layer 64 which forms the isolation region 68 is required to be a certain distance or more. As a result, there is a problem that the increase in the lateral expansion widths W4 and W5 of the P type buried diffusion layers 64 and 65 makes it difficult to reduce the device size of the NPN transistor 61.

SUMMARY OF THE INVENTION

The present invention has been made in consideration for the foregoing circumstances. A semiconductor device of the present invention includes a semiconductor substrate of one conductivity type, a first epitaxial layer of an opposite conductivity type formed on the semiconductor substrate, an second epitaxial layer of the opposite conductivity type formed on the first epitaxial layer, a isolation region of the one conductivity type which divides the first and second epitaxial layers into a plurality of element formation regions, a buried diffusion layer of the opposite conductivity type formed so as to expand in the semiconductor substrate and the first epitaxial layer, a first diffusion layer of the opposite conductivity type which is formed in the second epitaxial layer, and which is used as a collector region, a first diffusion layer of the one conductivity type which is formed in the second epitaxial layer, and which is used as a base region, and a second diffusion layer of the opposite conductivity type which is formed in the first diffusion layer of the one conductivity type, and which is used as an emitter region. In the second epitaxial layer, a third diffusion layer of the opposite conductivity type is formed between the isolation region and the first diffusion layer of the one conductivity type. Moreover, the second epitaxial layer has an impurity concentration higher than that of the first epitaxial layer. In the present invention, therefore, breakdown voltage characteristics can be improved by increasing the impurity concentration of the second epitaxial layer and by this making it hard for a short-circuit to occur between the base region and the isolation region.

Moreover, the semiconductor device of the present invention includes the first diffusion layer of one conductivity type is surrounded by the first diffusion layer of the opposite conductivity type and the third diffusion layer of the opposite conductivity type. In the present invention, therefore, the diffusion layers of the opposite conductivity type surround the base region of the one conductivity type. Use of this structure makes it hard for the short-circuit to occur between the base region and the isolation region. Thus, the breakdown voltage characteristics can be improved.

Moreover, the semiconductor device of the present invention further includes a buried diffusion layer of the one conductivity type which forms the isolation region, which is formed from a surface of the first epitaxial layer, and which is connected to the semiconductor substrate, and a second diffusion layer of the one conductivity type which forms the isolation region, which is formed from a surface of the second epitaxial layer, and which is connected to the buried diffusion layer of the one conductivity type. In the present invention, therefore, lateral expansion of the buried diffusion layer of the one conductivity type, which forms the isolation region, is suppressed. Thus, a device size can be reduced.

A method of manufacturing a semiconductor device according to the present invention includes the steps of: preparing a semiconductor substrate of one conductivity type, forming a first buried diffusion layer of an opposite conductivity type and a second buried diffusion layer of the opposite conductivity type in the semiconductor substrate, and thereafter forming an first epitaxial layer of the opposite conductivity type on the semiconductor substrate, implanting ions of impurities of the one conductivity type in a desired region of the first epitaxial layer, thereafter forming a second epitaxial layer of the opposite conductivity type on the first epitaxial layer, and forming a buried diffusion layer of the one conductivity type so as to expand in the first and second epitaxial layers, forming a first diffusion layer of the opposite conductivity type, which is used as a collector region, in the second epitaxial layer, forming a first diffusion layer of the one conductivity type, which is used as a base region, in the second epitaxial layer, forming a second diffusion layer of the opposite conductivity type, which is used as an emitter region, in the first diffusion layer of the one conductivity type, forming a second diffusion layer of the one conductivity type, which is connected to the buried diffusion layer of the one conductivity type, in the second epitaxial layer, forming, in the second epitaxial layer, a third diffusion layer of the opposite conductivity type, which is disposed between the first diffusion layer of the one conductivity type and the second diffusion layer of the one conductivity type, and a fourth diffusion layer of the opposite conductivity type, which is used as a back gate region, by the same ion implantation step, and forming, in the fourth diffusion layer of the opposite conductivity type, a third diffusion layer of the one conductivity type, which is used as a source region, and a fourth diffusion layer of the one conductivity type, which is used as a drain region. In the present invention, therefore, the third diffusion layer of the opposite conductivity type, which improves breakdown voltage characteristics, and the fourth diffusion layer of the opposite conductivity type, which is used as the back gate region, are formed by the same step. This manufacturing method enables reduction in the number of masks and reduction in manufacturing costs.

Moreover, the method of manufacturing a semiconductor device according to the present invention includes the second epitaxial layer is formed so as to have an impurity concentration higher than that of the first epitaxial layer. In the present invention, therefore, the breakdown voltage characteristics can be improved by increasing the impurity concentration of the second epitaxial layer and by this making it hard for a short-circuit to occur between the base region and the isolation region.

Moreover, the method of manufacturing a semiconductor device according to the present invention includes, after the second epitaxial layer is formed, an ion implantation step for forming the second diffusion layer of the one conductivity type is performed without performing a thermal diffusion step for expanding the buried diffusion layer of the one conductivity type. In the present invention, therefore, by controlling a thickness of the first epitaxial layer so that the dedicated thermal diffusion step for the buried diffusion layer of the one conductivity type can be omitted, the lateral expansion width of the buried diffusion layer of the one conductivity type can be suppressed.

Moreover, the method of manufacturing a semiconductor device according to the present invention includes, after a LOCOS oxide film is formed in the second epitaxial layer, ions of impurities of the one conductivity type for forming the second diffusion layer of the one conductivity type are implanted from a surface of the LOCOS oxide film. In the present invention, therefore, it is possible to reduce crystal defects in a formation region of the second diffusion layer of the one conductivity type.

DESCRIPTION OF THE PREFERRED EMBODIMENT

Figure 1:
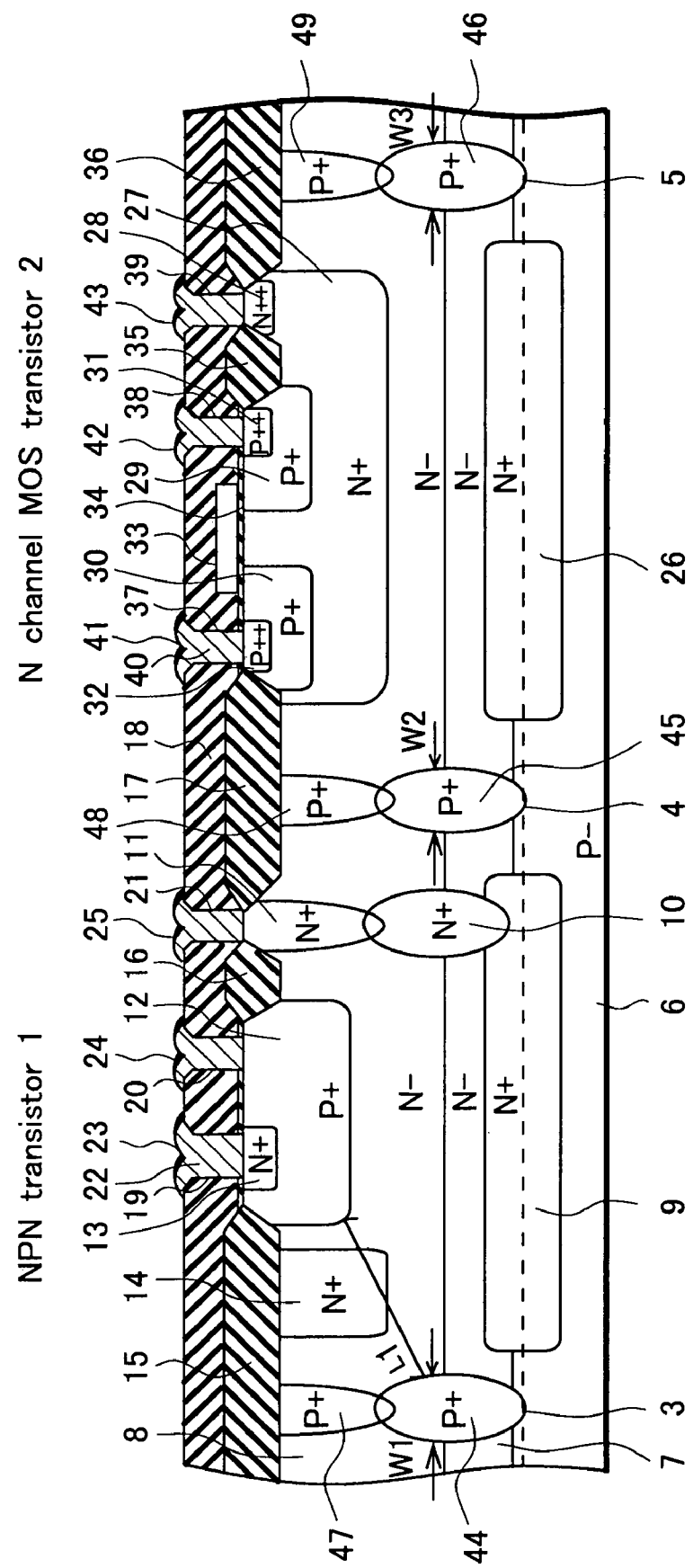
FIG. 1 is a cross-sectional view illustrating a semiconductor device according to an embodiment of the present invention.
Figure 2:
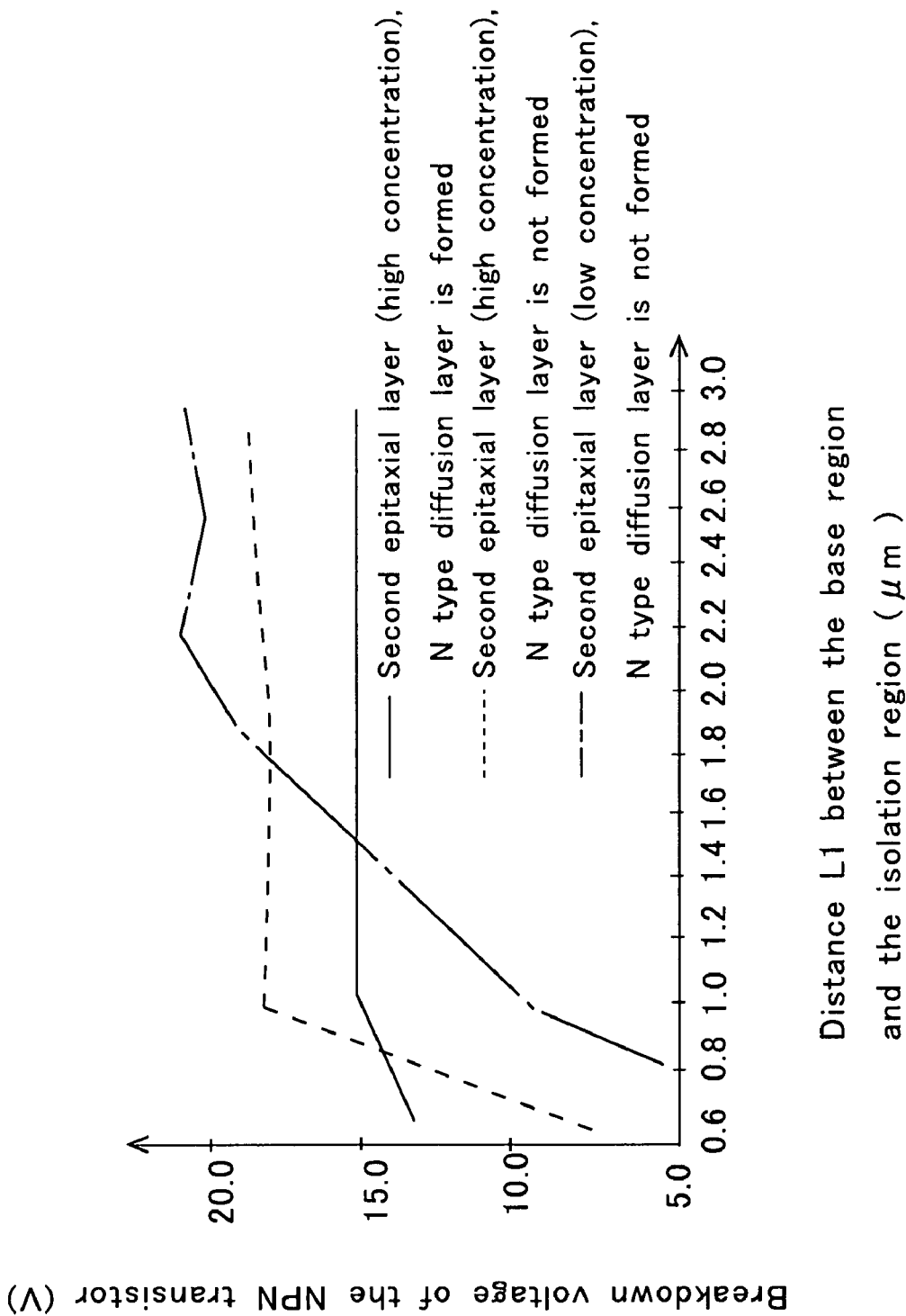
FIG. 2 is a graph illustrating breakdown voltage characteristics of the semiconductor device according to the embodiment of the present invention.

With reference to FIGS. 1 and 2, a semiconductor device according to an embodiment of the present invention will be described in detail below. FIG. 1 is a cross-sectional view illustrating the semiconductor device according to this embodiment. FIG. 2 is a graph illustrating breakdown voltage characteristics of the semiconductor device according to this embodiment.

As shown in FIG. 1, an NPN transistor 1 is formed in one of element formation regions divided by isolation regions 3, 4 and 5, and an N channel MOS (Metal Oxide Semiconductor) transistor 2 is formed in another element formation region. Note that, although not shown in FIG. 1, a P channel MOS transistor, a PNP transistor and the like are formed in other element formation regions.

As shown in FIG. 1, the NPN transistor 1 is mainly configured of: a P type single crystal silicon substrate 6, N type epitaxial layers 7 and 8, N type buried diffusion layers 9 and 10 used as a collector region, an N type diffusion layer 11 used as the collector region, a P type diffusion layer 12 used as a base region, an N type diffusion layer 13 used as an emitter region, and an N type diffusion layer 14.

The N type epitaxial layers 7 and 8 are formed on the P type single crystal silicon substrate 6. Specifically, on the substrate 6, the two epitaxial layers 7 and 8 are stacked. The first epitaxial layer 7 is formed so as to have, for example, a thickness of about 0.6 to 1.0 (μm) and a specific resistance value of about 1.25 (Ω·cm). Meanwhile, the second epitaxial layer 8 is formed so as to have, for example, a thickness of about 1.0 to 1.5 (μm) and a specific resistance value of about 0.50 (Ω·cm).

The N type buried diffusion layer 9 is formed so as to expand in the substrate 6 and the first epitaxial layer 7. Moreover, the N type buried diffusion layer 10 is formed so as to expand in the first epitaxial layer 7 and the second epitaxial layer 8. Furthermore, the N type buried diffusion layer 10 is connected to the N type buried diffusion layer 9.

The N type diffusion layer 11 is formed in the second epitaxial layer 8. The N type diffusion layer 11 is connected to the N type buried diffusion layer 10. Moreover, the N type buried diffusion layers 9 and 10 and the N type diffusion layer 11 are used as the collector region of the NPN transistor 1.

The P type diffusion layer 12 is formed in the second epitaxial layer 8, and is used as the base region.

The N type diffusion layer 13 is formed in the P type diffusion layer 12, and is used as the emitter region.

The N type diffusion layer 14 is formed in the second epitaxial layer 8. The N type diffusion layer 14 is disposed in a region which is located between the P type diffusion layer 12 and the isolation region 3, and where the N type diffusion layer 11 is not disposed. Moreover, the N type diffusion layer 14 may be disposed in the shape of a ring so as to surround the P type diffusion layer 12.

LOCOS oxide films 15, 16 and 17 are formed in the second epitaxial layer 8. Each of the LOCOS oxide films 15, 16 and 17 has a thickness of, for example, about 3000 to 10000 (Å) in its flat portion. Below the LOCOS oxide films 15 and 17, the P type isolation regions 3 and 4 are formed, respectively.

An insulating layer 18 is formed on an upper surface of the second epitaxial layer 8. The insulating layer 18 is formed of an NSG (Nondoped Silicate Glass) film, a BPSG (Boron Phospho Silicate Glass) film or the like. By use of a known photolithography technology, contact holes 19, 20 and 21 are formed in the insulating layer 18 by dry etching using, for example, $CHF_3$ or $CF_4$ gas.

In the contact holes 19, 20 and 21, aluminum alloy films 22 made of, for example, an Al—Si film, an Al—Si—Cu film, an Al—Cu film or the like are selectively formed. Thus, an emitter electrode 23, a base electrode 24 and a collector electrode 25 are formed.

Meanwhile, the P channel MOS transistor 2 is mainly configured of: the P type single crystal silicon substrate 6, the N type epitaxial layers 7 and 8, an N type buried diffusion layer 26, N type diffusion layers 27 and 28 used as a back gate region, P type diffusion layers 29 and 31 used as a source region, P type diffusion layers 30 and 32 used as a drain region, and a gate electrode 33.

The N type epitaxial layers 7 and 8 are formed on the P type single crystal silicon substrate 6.

The N type buried diffusion layer 26 is formed so as to expand in the substrate 6 and the first epitaxial layer 7.

The N type diffusion layer 27 is formed in the second epitaxial layer 8. In the N type diffusion layer 27, the N type diffusion layer 28 is formed so as to have a formation region thereof overlap with that of the N type diffusion layer 27. The N type diffusion layer 28 is used as a back gate draw-out region.

The P type diffusion layers 29 and 30 are formed in the N type diffusion layer 27. The P type diffusion layer 29 is used as the source region. The P type diffusion layer 30 is used as the drain region. The P type diffusion layer 31 is formed in the P type diffusion layer 29, and the P type diffusion layer 32 is formed in the P type diffusion layer 30. By use of this structure, the drain region is formed to have a DDD (Double Diffused Drain) structure. Moreover, the N type diffusion layer 27 positioned between the P type diffusion layers 29 and 30 is used as a channel region. On an upper surface of the epitaxial layer 8 above the channel region, a gate oxide film 34 is formed.

The gate electrode 33 is formed on an upper surface of the gate oxide film 34. The gate electrode 33 is formed of, for example, a polysilicon film and a tungsten silicide film so as to have a desired thickness. Although not shown in FIG. 1, a silicon oxide film is formed on an upper surface of the tungsten silicide film.

LOCOS oxide films 17, 35 and 36 are formed in the second epitaxial layer 8.

The insulating layer 18 is formed on an upper surface of the second epitaxial layer 8. By use of the known photolithography technology, contact holes 37, 38 and 39 are formed in the insulating layer 18 by dry etching using, for example, $CHF_3$ or $CF_4$ gas.

In the contact holes 37, 38 and 39, aluminum alloy films 40 made of, for example, an Al—Si film, an Al—Si—Cu film, an Al—Cu film or the like are selectively formed. Thus, a drain electrode 41, a source electrode 42 and a back gate electrode 43 are formed.

In this embodiment, as described above, the second epitaxial layer 8 is formed so as to have an impurity concentration higher than that of the first epitaxial layer 7. By use of this structure, as to a depletion layer spreading from a PN junction region between the P type diffusion layer 12 and the N type epitaxial layer 8, the N type epitaxial layer 8 hinders the depletion layer from spreading toward the N type epitaxial layers 7 and 8 side. Similarly, as to a depletion layer spreading from a PN junction region between the P type isolation region 3 and the N type epitaxial layers 7 and 8, the N type epitaxial layer 8 also hinders the depletion layer from spreading. Moreover, using the impurity concentration of the N type epitaxial layer 8 to control the spread of the depletion layers makes it hard for the short-circuit to occur between the base region and the isolation region. Thus, the breakdown voltage characteristics of the NPN transistor 1 can be improved.

Moreover, in this embodiment, the N type diffusion layer 14 is formed in the epitaxial layer 8 below the LOCOS oxide film 15. The N type diffusion layer 14 is disposed between the P type diffusion layer 12 used as the base region and the P type isolation region 3. By disposing the N type diffusion layer 14, the impurity concentration of the epitaxial layer 8 between the P type diffusion layer 12 and the P type isolation region 3 is further increased. By use of this structure, as to the depletion layer spreading from the PN junction region between the P type diffusion layer 12 and the N type epitaxial layer 8, the N type diffusion layer 14 and the N type epitaxial layer 8 hinder the depletion layer from spreading toward the N type epitaxial layers 7 and 8 side. Similarly, as to the depletion layer spreading from the PN junction region between the P type isolation region 3 and the N type epitaxial layers 7 and 8, the N type diffusion layer 14 and the N type epitaxial layer 8 also hinder the depletion layer from spreading. Moreover, by using the impurity concentrations of the N type diffusion layer 14 and the N type epitaxial layer 8 to control the spread of the depletion layers makes it hard for the short-circuit to occur between the base region and the isolation region. Thus, the breakdown voltage characteristics of the NPN transistor 1 can be improved. Furthermore, by forming the N type diffusion layer 14, it can be hard for the short-circuit to occur between the base region and the isolation region, which is caused by inversion of the surface of the epitaxial layer 8 due to an influence of a wiring layer formed on the LOCOS oxide film 15, for example.

In FIG. 2, a horizontal axis indicates the distance L1 between the base region (the P type diffusion layer 12) and the isolation region 3, and a vertical axis indicates the breakdown voltage characteristics of the NPN transistor 1. The solid line shows a structure in which the second epitaxial layer 8 has a high impurity concentration and the N type diffusion layer 14 is formed. A dotted line shows a structure in which the second epitaxial layer 8 has a high impurity concentration and the N type diffusion layer 14 is not formed. A chain dashed line shows a structure in which the second epitaxial layer 8 has a low impurity concentration and the N type diffusion layer 14 is not formed. Note that, the distance L1 is set to be a distance between the P type diffusion layer 12 and the P type isolation region 3, which affects the breakdown voltage characteristics of the NPN transistor 1.

As indicated by the solid line, up to about 1.0 (μm), the longer the distance L1, the more the breakdown voltage characteristics of the NPN transistor 1 are improved. When the distance L1 is about 1.0 (μm) or more, the breakdown voltage of the NPN transistor 1 is stabilized at about 15.0 (V). Specifically, in the NPN transistor 1, by setting the second epitaxial layer 8 to have a high impurity concentration and by forming the N type diffusion layer 14, the breakdown voltage characteristics thereof can be stabilized with little influence of the distance L1.

Meanwhile, as indicated by the dotted line, up to about 1.0 (μm), the longer the distance L1, the more the breakdown voltage characteristics of the NPN transistor 1 are improved. When the distance L1 is about 1.0 (μm) or more, the breakdown voltage of the NPN transistor 1 is stabilized at about 18.0 (V). Specifically, in the NPN transistor 1, by setting the second epitaxial layer 8 to have a high impurity concentration, the breakdown voltage characteristics can be stabilized. However, compared with the structure indicated by the solid line, the transistor is likely to be affected by the distance L1 up to about 1.0 (μm). To this end, it is found out that, up to about 1.0 (μm) of the distance L1, the breakdown voltage characteristics of the NPN transistor 1 are set stable by disposing the N type diffusion layer 14.

Moreover, as indicated by the chain dashed line, in a case where the second epitaxial layer 8 is formed to have a low impurity concentration and the N type diffusion layer 14 is not formed, the longer the distance L1, the more the breakdown voltage characteristics of the NPN transistor 1 are improved. However, it is found out that, compared with the cases indicated by the solid line and the dotted line, the breakdown voltage characteristics of the NPN transistor 1 are not set stable.

Furthermore, in this embodiment, the isolation regions 3, 4 and 5 are formed by connecting P type buried diffusion layers 44, 45 and 46, which are expanded from the surface of the first epitaxial layer 7, to P type diffusion layers 47, 48 and 49, respectively, which are expanded from the surface of the second epitaxial layer 8. Moreover, the P type buried diffusion layers 44, 45 and 46 are connected to the substrate 6.

Here, although varying depending on the breakdown voltage characteristics of the NPN transistor 1, description will be given of the case where, for example, thicknesses of the epitaxial layers 7 and 8 are about 2.1 (μm) in total. The thickness of the first epitaxial layer 7 is set to about 0.6 (μm) and the thickness of the second epitaxial layer 8 is set to about 1.5 (μm). In this case, the P type buried diffusion layers 44, 45 and 46 expand toward the epitaxial layer 7 side by about 0.6 (μm). Moreover, lateral expansion widths W1, W2 and W3 respectively of the P type buried diffusion layers 44, 45 and 46 are set to about 0.48 (μm). This is because, although varying depending on a crystalline state of the epitaxial layer and the like, the lateral expansion width of the diffusion layer is about 0.8 times an upward expansion width (or a downward expansion width) of the diffusion layer.

Figure 9:
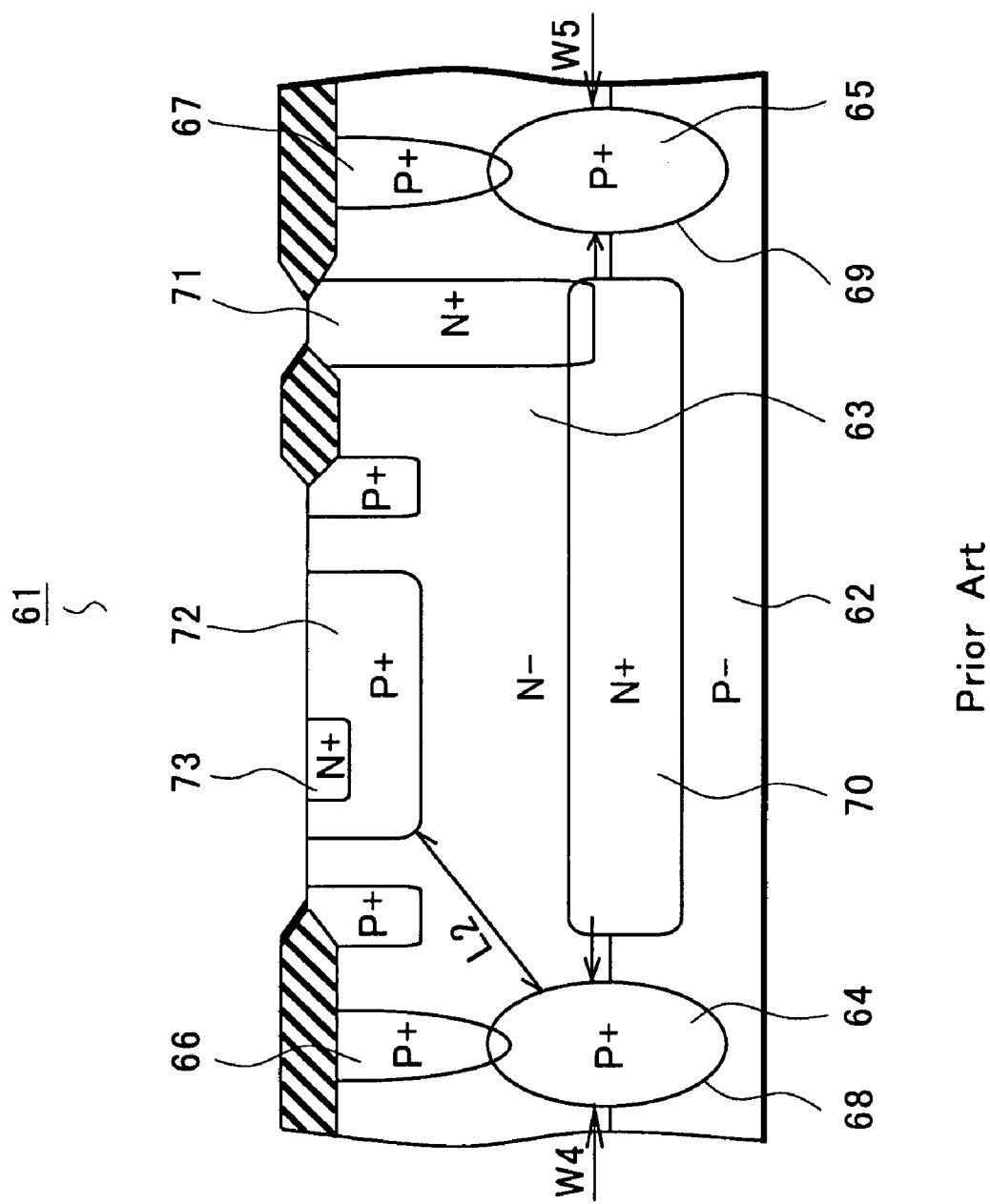
FIG. 9 is a cross-sectional view illustrating a semiconductor device according to a conventional embodiment.

Meanwhile, as described with reference to FIG. 9, considered is a case where one epitaxial layer 63 having a thickness of 2.1 (μm) is deposited on a substrate 62 in a conventional structure. In this case, since P type buried diffusion layers 64 and 65 are expanded from the surface of the substrate 62, the P type buried diffusion layers 64 and 65 expand toward the epitaxial layer 63 side by about 1.2 (μm). Accordingly, the lateral expansion widths W4 and W5 respectively of the P type buried diffusion layers 64 and 65 are set to about 0.96 (μm) as in the case of the foregoing case.

Specifically, by expanding the P type buried diffusion layers 44, 45 and 46 shown in FIG. 1 vertically (in a depth direction) from the surface of the first epitaxial layer 7, the expansion widths thereof are suppressed. Thus, the lateral expansion widths W1, W2 and W3 can be reduced. Moreover, as in the case of the conventional structure, in the distance L1 between the P type diffusion layer 12 and the P type isolation region 3, a certain width is required depending on the breakdown voltage characteristics of the NPN transistor 1. However, by reducing the lateral expansion widths W1, W2 and W3 respectively of the P type buried diffusion layers 44, 45 and 46, the device size of the NPN transistor 1 can be reduced.

Furthermore, as described above with reference to FIG. 2, by forming the N type diffusion layer 14 and by setting the N type epitaxial layer 8 to have the high impurity concentration, the distance L1 can also be shortened while maintaining the breakdown voltage characteristics. Thus, the device size of the NPN transistor 1 can also be reduced.

Note that, in this embodiment, as to the region where the N type diffusion layer 14 is disposed, various design changes can be made depending on the breakdown voltage characteristics of the NPN transistor 1. For example, in a region where the N type diffusion layer 11 is disposed between the P type diffusion layer 12 and each of the P type isolation regions 3 and 4, the N type diffusion layer 14 does not have to be disposed. Moreover, also in a region where desired breakdown voltage characteristics are secured by the distance L1 between the P type diffusion layer 12 and each of the P type isolation regions 3 and 4, the N type diffusion layer 14 does not have to be disposed. Specifically, the N type diffusion layer 14 may be disposed at least in the region where the N type diffusion layer 11 is not formed between the P type diffusion layer 12 and each of the P type isolation regions 3 and 4 and the region where the distance L1 between the P type diffusion layer 12 and each of the P type isolation regions 3 and 4 is short.

Moreover, in this embodiment, the description has been given of the case where the two epitaxial layers 7 and 8 are formed on the substrate 6. However, the present invention is not limited to this case. For example, even in a case where three or more of epitaxial layers are stacked on the substrate, the same effect can be obtained by forming the N type diffusion layer between the base region and the isolation region. Moreover, the same effect can be obtained by setting the N type epitaxial layer, in which the base region is formed, to have a high impurity concentration.

Moreover, as shown in FIG. 1, the dotted line indicates a boundary region between the substrate 6 and the first epitaxial layer 7. As described above, the substrate 6 contains P type impurities, and P type diffusion regions expanding from the substrate 6 are formed in the epitaxial layer 7. By use of this structure, the lateral expansion widths W1, W2 and W3 respectively of the P type buried diffusion layers 44, 45 and 46 are further suppressed by connecting the P type buried diffusion layers 44, 45 and 46 to the P type diffusion regions described above. Accordingly, the device size of the NPN transistor 1 is also further reduced.

Moreover, in this embodiment, the description has been given of the case where the isolation regions 3, 4 and 5 are formed by expanding the P type buried diffusion layers 44, 45 and 46 respectively from the surface of the first epitaxial layer 7 and by expanding the P type diffusion layers 47, 48 and 49 respectively from the surface of the second epitaxial layer 8. However, the present invention is not limited to this case. For example, the present invention may be applied to a case where a P type buried diffusion layer is further formed from the surface of the substrate 6 and the isolation regions 3, 4 and 5 are formed of the P type buried diffusion layers 44, 45 and 46 and the P type diffusion layers 47, 48 and 49, respectively. In this case, the lateral expansion widths W1, W2 and W3 respectively of the P type buried diffusion layers 44, 45 and 46 can be further reduced.

Next, with reference to FIGS. 3 to 8, detailed description will be given of a method of manufacturing a semiconductor device according to an embodiment of the present invention. FIGS. 3 to 8 are cross-sectional views illustrating the method of manufacturing a semiconductor device according to this embodiment.

Figure 3:
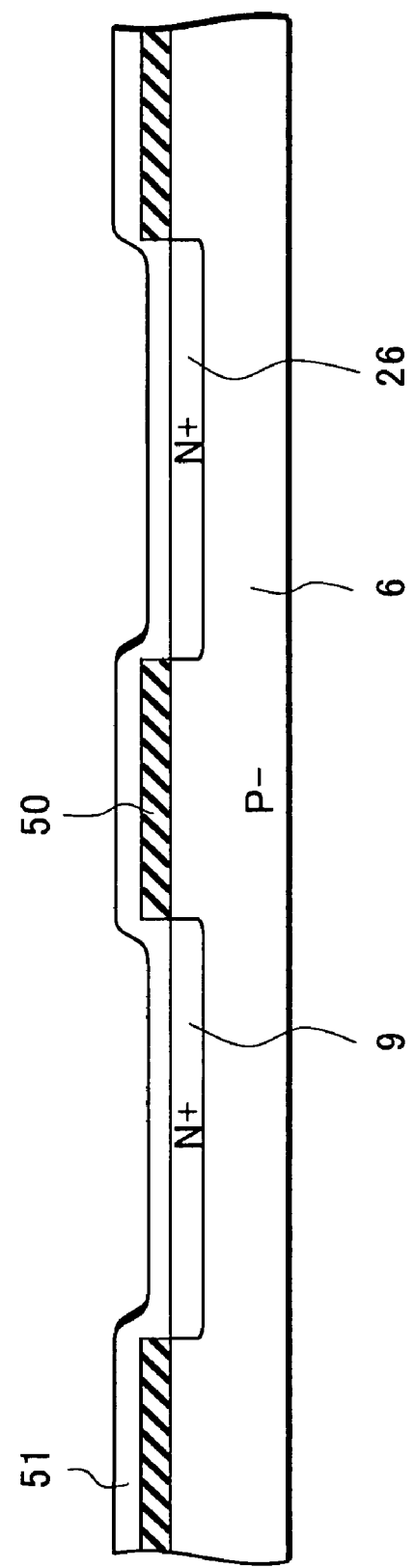
FIG. 3 is a cross-sectional view illustrating a method of manufacturing a semiconductor device according to the embodiment of the present invention.

First, as shown in FIG. 3, a P type single crystal silicon substrate 6 is prepared. A silicon oxide film 50 is formed on the substrate 6, and the silicon oxide film 50 is selectively removed so as to form openings on formation regions of N type buried diffusion layers 9 and 26. Thereafter, by using the silicon oxide film 50 as a mask, a liquid source 51 containing N type impurities, for example, antimony (Sb) is applied onto a surface of the substrate 6 by use of a spin-coating method. Subsequently, after the antimony (Sb) is thermally diffused to form the N type buried diffusion layers 9 and 26, the silicon oxide film 50 and the liquid source 51 are removed.

Figure 4:
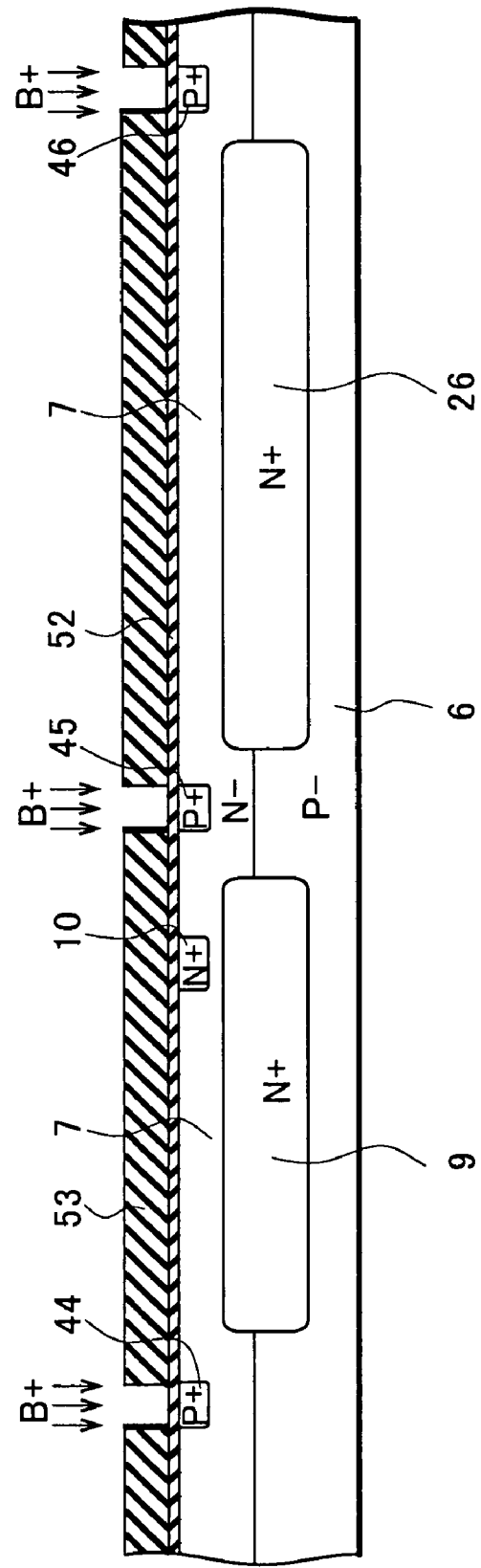
FIG. 4 is a cross-sectional view illustrating the method of manufacturing a semiconductor device according to the embodiment of the present invention.

Next, as shown in FIG. 4, the substrate 6 is placed on a susceptor of a vapor phase epitaxial growth apparatus, and an N type epitaxial layer 7 is formed on the substrate 6. In this event, the epitaxial layer 7 is formed so as to have, for example, a thickness of about 0.6 to 1.0 (μm) and a specific resistance value of about 1.25 (Ω·cm). The N type buried diffusion layers 9 and 26 are expanded by heat treatment in the step of forming the epitaxial layer 7 by the thermal diffusion. Thereafter, a silicon oxide film 52 is formed on the epitaxial layer 7, and a photoresist (not shown) having an opening on a formation region of an N type buried diffusion layer 10 to be described later is used as a mask to form the N type buried diffusion layer 10 by use of, for example, an ion implantation method. Note that, the step of forming the N type buried diffusion layer 10 may be omitted.

Here, the vapor phase epitaxial growth apparatus mainly includes a gas supply system, a reactor, an exhaust system and a control system. In this embodiment, productivity and thickness uniformity of the epitaxial layers can be improved by using a sheet reactor.

Next, a photoresist 53 is formed on the silicon oxide film 52. Thereafter, by use of a known photolithography technology, openings are formed in the photoresist 53 on regions where P type buried diffusion layers 44, 45 and 46 are formed. Subsequently, ions of P type impurities, for example, boron (B) are implanted from a surface of the epitaxial layer 7 at an accelerating voltage of 180 to 200 (keV) and a dose of $1.0 \times 10^{12}$ to $1.0 \times 10^{14}$ (/cm²). Note that, in this embodiment, impurity concentration peaks of the ion implanted P type buried diffusion layers 44, 45 and 46 are positioned at a depth of about 0.2 to 0.3 (μm) from the surface of the epitaxial layer 7. Furthermore, impurity concentration peak positions by the ion implantation can be arbitrarily controlled by arbitrarily changing the accelerating voltage of the ion implantation. Based on the peak positions, formation positions of the P type buried diffusion layers 44, 45 and 46 can be controlled. Subsequently, the silicon oxide film 52 and the photoresist 53 are removed without expanding the P type buried diffusion layers 44, 45 and 46 by the thermal diffusion.

Figure 5:
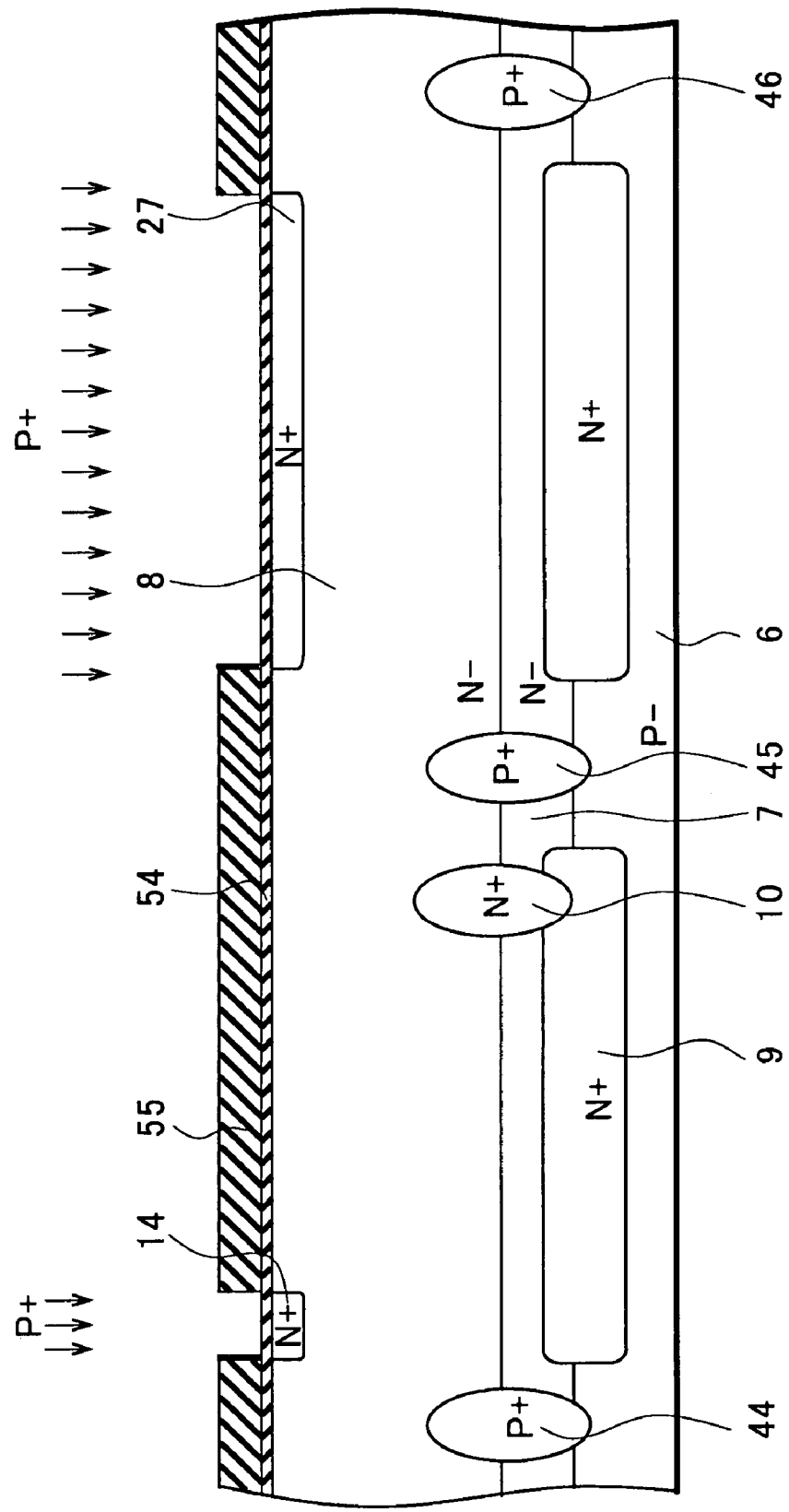
FIG. 5 is a cross-sectional view illustrating the method of manufacturing a semiconductor device according to the embodiment of the present invention.

Next, as shown in FIG. 5, the substrate 6 is placed on the susceptor of the vapor phase epitaxial growth apparatus, and an N type epitaxial layer 8 is formed on the epitaxial layer 7. In this event, the epitaxial layer 8 is formed so as to have, for example, a thickness of about 1.0 to 1.5 (μm) and a specific resistance value of about 0.50 (Ω·cm). Moreover, thicknesses of the epitaxial layers 7 and 8 are set to, for example, about 2.0 to 2.1 (μm) in total. The P type buried diffusion layers 44, 45 and 46 are expanded by heat treatment in the step of forming the epitaxial layer 8 by the thermal diffusion.

Thereafter, a silicon oxide film 54 is formed on the epitaxial layer 8, and a photoresist 55 is formed on the silicon oxide film 54. Subsequently, by use of the known photolithography technology, openings are formed in the photoresist 55 on regions where N type diffusion layers 14 and 27 are formed. Thereafter, ions of N type impurities, for example, phosphorus (P) are implanted from the surface of the epitaxial layer 8 at an accelerating voltage of 70 to 90 (keV) and a dose of $1.0 \times 10^{11}$ to $1.0 \times 10^{13}$ (/cm²). Subsequently, after the photoresist 55 is removed and the N type diffusion layers 14 and 27 are formed by thermal diffusion, the silicon oxide film 54 is removed (see FIG. 6).

Here, in this embodiment, the N type diffusion layer 14 of an NPN transistor 1 and the N type diffusion layer 27 of a P channel MOS transistor 2 are formed by use of the same mask and the same ion implantation step. Thus, breakdown voltage characteristics of the NPN transistor 1 can be improved without increasing the number of masks.

Figure 6:
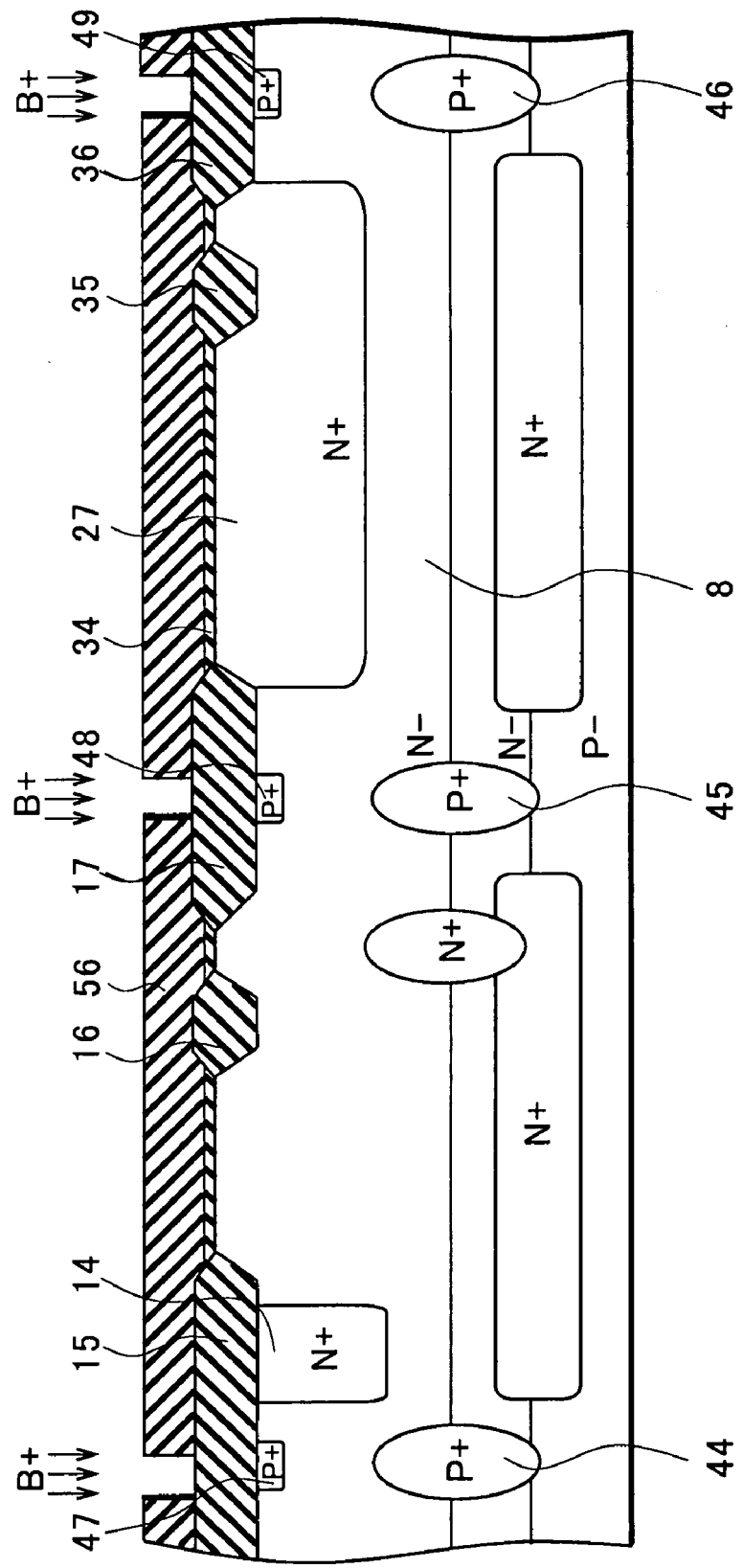
FIG. 6 is a cross-sectional view illustrating the method of manufacturing a semiconductor device according to the embodiment of the present invention.

As shown in FIG. 6, LOCOS oxide films 15, 16, 17, 35 and 36 are formed in desired regions of the epitaxial layer 8. Thereafter, a silicon oxide film to be used as a gate oxide film 34 is formed on an upper surface of the epitaxial layer 8. Subsequently, a photoresist 56 is formed on the silicon oxide film. By use of the known photolithography technology, openings are formed in the photoresist 56 on regions where P type diffusion layers 47, 48 and 49 are formed. Thereafter, ions of P type impurities, for example, boron (B) are implanted from the surface of the epitaxial layer 8 at an accelerating voltage of 150 to 170 (keV) and a dose of $1.0 \times 10^{12}$ to $1.0 \times 10^{14}$ (/cm²). Subsequently, the photoresist 56 is removed, and the P type diffusion layers 47, 48 and 49 are formed by thermal diffusion (see FIG. 7).

In this event, the P type diffusion layers 47, 48 and 49 are formed without performing the thermal diffusion step for expanding the P type buried diffusion layers 44, 45 and 46 after the epitaxial layer 8 is formed. This manufacturing method makes it possible to omit the thermal diffusion step for expanding the P type buried diffusion layers 44, 45 and 46, which has been required in the conventional manufacturing method, by controlling the thickness of the epitaxial layer 7. By use of the manufacturing method, compared with the conventional manufacturing method, the one thermal diffusion step described above can be omitted for the P type buried diffusion layers 44, 45 and 46. Moreover, lateral expansion widths W1, W2 and W3 respectively (see FIG. 1) of the P type buried diffusion layers 44, 45 and 46 can be reduced. Thus, the device size of the NPN transistor 1 can be reduced.

Moreover, after the LOCOS oxide films 15, 17 and 36 are formed, ions of boron (B) are implanted from the surface of the LOCOS oxide films 15, 17 and 36. This manufacturing method can prevent formation of crystal defects due to heat during formation of the LOCOS oxide films 15, 17 and 36 from the surface of the epitaxial layer 8 damaged by implanting the ions of boron (B) having a relatively large molecular level.

Figure 7:
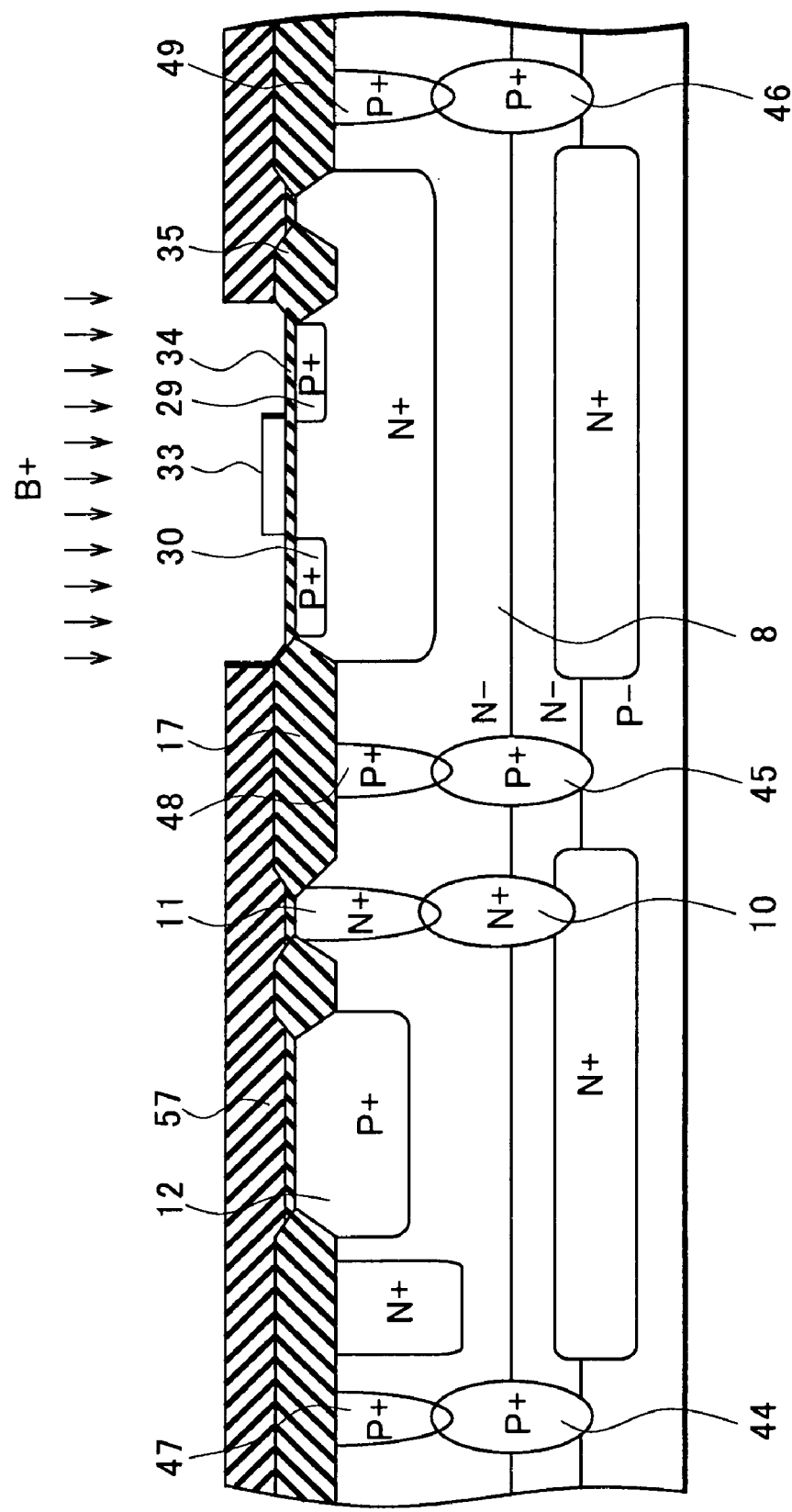
FIG. 7 is a cross-sectional view illustrating the method of manufacturing a semiconductor device according to the embodiment of the present invention.

Next, as shown in FIG. 7, a photoresist (not shown) having an opening on a formation region of an N type diffusion layer 11 is used as a mask to form the N type diffusion layer 11 by use of, for example, the ion implantation method. Note that, depending on a formation depth of the N type diffusion layer 11, a diffusion step may be included after the ion implantation. Moreover, a photoresist (not shown) having an opening on a formation region of a P type diffusion layer 12 is used as a mask to form the P type diffusion layer 12 by use of, for example, the ion implantation method. Thereafter, a polysilicon film and a tungsten silicide film, for example, are sequentially formed on the gate oxide film 34 to form a gate electrode 33 by use of the known photolithography technology. Subsequently, a photoresist 57 is formed on the silicon oxide film used as the gate oxide film 34. By use of the known photolithography technology, openings are formed in the photoresist 57 on regions where P type diffusion layers 29 and 30 are to be formed. Subsequently, ions of P type impurities, for example, boron (B) are implanted from the surface of the epitaxial layer 8 to form the P type diffusion layers 29 and 30. In this event, by utilizing the LOCOS oxide films 17 and 35 and the gate electrode 33 as a mask, the P type diffusion layers 29 and 30 can be formed with good positional accuracy. Thereafter, the photoresist 57 is removed.

Figure 8:
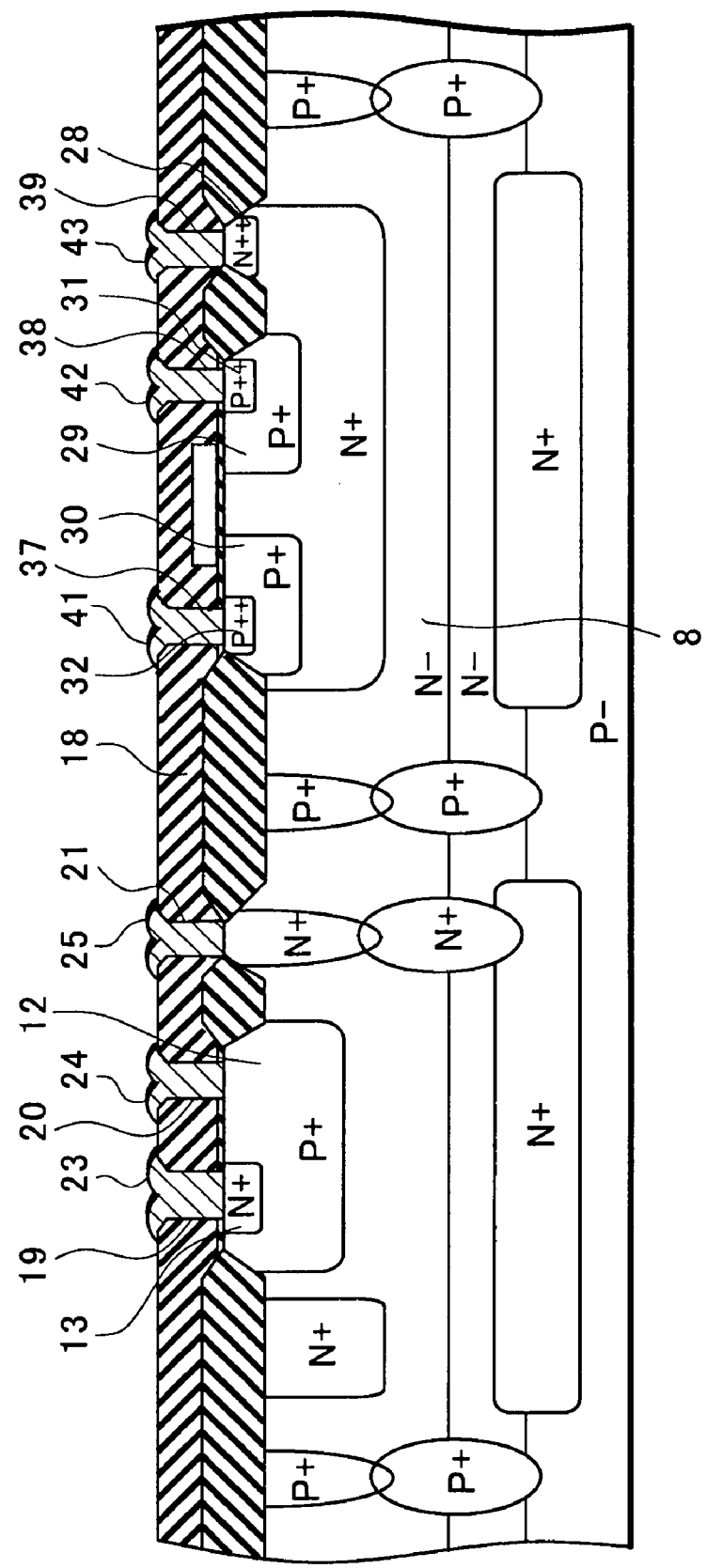
FIG. 8 is a cross-sectional view illustrating the method of manufacturing a semiconductor device according to the embodiment of the present invention.

Next, as shown in FIG. 8, by use of the known photolithography technology, N type diffusion layers 13 and 28 are formed after P type diffusion layers 31 and 32 is formed.

Thereafter, on the epitaxial layer 8, an NSG film, a BPSG film or the like, for example, is deposited as an insulating layer 18. Subsequently, by use of the known photolithography technology, contact holes 19, 20, 21, 37, 38 and 39 are formed in the insulating layer 18 by dry etching using, for example, $CHF_3$ or $CF_4$ gas. In the contact holes 19, 20, 21, 37, 38 and 39, aluminum alloy films made of, for example, an Al—Si film, an Al—Si—Cu film, an Al—Cu film or the like are selectively formed. Thus, an emitter electrode 23, a base electrode 24, a collector electrode 25, a drain electrode 41, a source electrode 42 and a back gate electrode 43 are formed.

Note that, in this embodiment, the description has been given of the case where isolation regions 3, 4 and 5 are formed by expanding the P type buried diffusion layers 44, 45 and 46 respectively from the surface of the first epitaxial layer 7 and by expanding the P type diffusion layers 47, 48 and 49 respectively from the surface of the second epitaxial layer 8. However, the present invention is not limited to this case. For example, the present invention may be applied to a case where a P type buried diffusion layer is further formed from the surface of the substrate 6 and the isolation regions 3, 4 and 5 are formed of the P type buried diffusion layers 44, 45 and 46 and the P type diffusion layers 47, 48 and 49, respectively. In this case, the lateral expansion widths W1, W2 and W3 respectively of the P type buried diffusion layers 44, 45 and 46 can be further reduced.

Moreover, in this embodiment, the description has been given of the case where the N type buried diffusion layers 9 and 26 are formed so as to expand in the substrate 6 and the first epitaxial layer 7. However, the present invention is not limited to this case. For example, the present invention may be applied to a case where an N type buried diffusion layer larger than the N type buried diffusion layer 10 is formed so as to expand in the first and second epitaxial layers 7 and 8, and is connected to the N type buried diffusion layer 9 in the formation region of the NPN transistor 1. In this case, a collector resistance of the NPN transistor 1 can be reduced. Besides, various changes can be made without departing from the scope of the present invention.

In the embodiment of the present invention, the impurity concentration of the epitaxial layer having the base region formed therein is higher than that of the lower epitaxial layer. Use of this structure makes it hard for the short-circuit to occur between the base region and the isolation region. Thus, the breakdown voltage characteristics of an NPN transistor can be improved.

Moreover, in the embodiment of the present invention, an N type diffusion layer is formed between the base region of the NPN transistor and the isolation region. Use of this structure make it hard for the short-circuit to occur between the base region and the isolation region. Thus, the breakdown voltage characteristics of the NPN transistor can be improved.

Moreover, in the embodiment of the present invention, the two epitaxial layers are formed on the substrate. The buried diffusion layer, which forms the isolation region, is expanded from the surface of the first epitaxial layer. By use of this structure, a lateral expansion width of the buried diffusion layer is reduced. Thus, the device size can be reduced.

Moreover, in the embodiment of the present invention, an N type diffusion layer, which improves the breakdown voltage characteristics of the NPN transistor, and an N type diffusion layer, which is a back gate region of a P channel MOS transistor, are formed by the same step. This manufacturing method enables reduction in the number of masks and reduction in manufacturing costs.

Moreover, in the embodiment of the present invention, the buried diffusion layer, which forms the isolation region, is formed from the surface of the first epitaxial layer, and the method includes no dedicated thermal diffusion step of expanding the buried diffusion layer. By use of this manufacturing method, the lateral expansion width of the buried diffusion layer is reduced. Thus, the device size can be reduced.

Moreover, in the embodiment of the present invention, after the LOCOS oxide film is formed, the diffusion layer which forms the isolation region is formed. This manufacturing method makes it possible to reduce crystal defects formed on a surface of a formation region of the diffusion layer and in a region adjacent thereto.

What is claimed is:

1. A semiconductor device comprising:
   a semiconductor substrate of a first general conductivity type;
   a first epitaxial layer of a second general conductivity type disposed on the semiconductor substrate;
   a second epitaxial layer of the second general conductivity type disposed on the first epitaxial layer;
   an isolation region of the first general conductivity type and isolating a portion of the first and second epitaxial layers from another portion of the first and second epitaxial layers;
   a buried diffusion layer of the second general conductivity type formed so as to extend in the semiconductor substrate and the first epitaxial layer;
   a first diffusion layer of the second general conductivity type formed in the second epitaxial layer so as to operate as a collector region;
   a first diffusion layer of the first general conductivity type formed in the second epitaxial layer so as to operate as a base region;
   a second diffusion layer of the second conductivity type formed in the first diffusion layer of the first general conductivity type so as to operate as an emitter region; and a third diffusion layer of the second general conductivity type formed in the second epitaxial layer between the isolation region and the first diffusion layer of the first general conductivity type, wherein an impurity concentration of the second epitaxial layer is higher than an impurity concentration of the first epitaxial layer, and an impurity concentration of the first diffusion layer of the second general conductivity type is higher than the impurity concentration of the second epitaxial layer, and the third diffusion layer of the second general conductivity type is connected electrically to the collector region.

2. The semiconductor device of claim 1, wherein the first diffusion layer of the first general conductivity type is surrounded by the first diffusion layer of the second general conductivity type and the third diffusion layer of the second general conductivity type.

3. The semiconductor device of claim 1, wherein the isolation region comprises a buried diffusion layer of the first general conductivity type formed in the semiconductor substrate and the first and second epitaxial layers and further comprises a second diffusion layer of the first general conductivity type formed in the second epitaxial layer so as to be in contact with the buried diffusion layer of the first general conductivity type.

4. The semiconductor device of claim 1, wherein the third diffusion layer of the second general conductivity type is not in contact with the first epitaxial layer of a second general conductivity type.

5. The semiconductor device of claim 1, wherein there is no isolation region between the first diffusion layer of the first general conductivity type and the third diffusion layer of the second general conductivity type.

* * * * *